US011997835B2

(12) United States Patent
Ma

(10) Patent No.: US 11,997,835 B2
(45) Date of Patent: May 28, 2024

(54) COOLING SYSTEM

(71) Applicant: Beijing Tusen Zhitu Technology Co., Ltd., Beijing (CN)

(72) Inventor: Zhihua Ma, Beijing (CN)

(73) Assignee: BEIJING TUSEN ZHITU TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 18/298,430

(22) Filed: Apr. 11, 2023

(65) Prior Publication Data

US 2023/0247805 A1  Aug. 3, 2023

Related U.S. Application Data

(60) Division of application No. 17/217,817, filed on Mar. 30, 2021, now Pat. No. 11,632,880, which is a (Continued)

(30) Foreign Application Priority Data

Nov. 8, 2017  (CN) .......................... 201711088430.3

(51) Int. Cl.
   *H05K 7/20*  (2006.01)

(52) U.S. Cl.
   CPC ..... *H05K 7/20863* (2013.01); *H05K 7/20727* (2013.01); *H05K 7/20809* (2013.01); *H05K 7/20881* (2013.01)

(58) Field of Classification Search
   CPC ... H01L 23/427; G06F 1/20; G06F 2200/201; G06F 1/206; G06F 1/183; H05K 7/20727;
   (Continued)

(56) References Cited

U.S. PATENT DOCUMENTS

5,361,188 A * 11/1994 Kondou ................ H01L 23/467
                                                       165/104.34
5,528,454 A    6/1996 Niklos
(Continued)

FOREIGN PATENT DOCUMENTS

CN    201369011 Y    12/2009
CN    204464810 U    7/2015
(Continued)

OTHER PUBLICATIONS

Chinese Application No. 201711088430.3 Office Action dated Feb. 19, 2019.

Primary Examiner — Michael A Matey
(74) Attorney, Agent, or Firm — Perkins Coie LLP

(57) ABSTRACT

The present disclosure provides a cooling system. The cooling system includes: a first set of fans mounted on an inward-facing side of an air inlet on an outer shell of a case; a second set of fans mounted on an inward-facing side of an air outlet on the outer shell of the case, for generating, in cooperation with the first set of fans, a high-pressure airflow from the air inlet to the air outlet; a first heat sink connected to heat generating component in the case, for absorbing heat from the heat generating component and transferring the absorbed heat to a second heat sink; and the second heat sink mounted on an inward-facing side of the second set of fans and cooled by the high-pressure airflow.

13 Claims, 9 Drawing Sheets

Related U.S. Application Data continuation of application No. 16/242,845, filed on Jan. 8, 2019, now Pat. No. 10,973,152.

(58) Field of Classification Search
CPC ........... H05K 7/20836; H05K 7/20772; H05K 7/20781; H05K 7/20809; H05K 7/20172; H05K 7/20154; H05K 7/20736; H05K 7/20272; H05K 7/2079; H05K 7/20209; H05K 7/20254; H05K 7/20336; H05K 7/20409; H05K 7/20827; H05K 7/20136; H05K 7/20163; H05K 7/2019; H05K 7/20381; H05K 7/20436; H05K 7/20563; H05K 7/206; H05K 7/20818; H05K 1/0203; H05K 1/0306; H05K 1/181; H05K 2201/064; H05K 2201/066; F04D 25/166; F28D 2021/0029; F28D 2021/0031; F28D 9/0081; F28F 3/02
See application file for complete search history.

(56) References Cited

U.S. PATENT DOCUMENTS

| | | | |
|---|---|---|---|
| 5,949,646 A | 9/1999 | Lee | |
| 5,986,882 A | 11/1999 | Ekrot | |
| 6,174,841 B1 | 1/2001 | Yamada | |
| 6,888,725 B2 | 5/2005 | Kubo | |
| 7,142,424 B2 | 11/2006 | Malone | |
| 7,367,384 B2* | 5/2008 | Madara | G06F 1/203 |
| | | | 165/122 |
| 8,564,951 B1 | 10/2013 | Watanabe | |
| 9,261,310 B2 | 2/2016 | Fried | |
| 9,910,231 B2 | 3/2018 | Kelty | |
| 10,349,561 B2 | 7/2019 | Farshchian | |
| 10,571,199 B2 | 2/2020 | Chang | |
| 10,973,152 B2 | 4/2021 | Ma | |
| 11,281,398 B1* | 3/2022 | Zheng | G06F 13/4282 |
| 2002/0036890 A1 | 3/2002 | Furuya | |
| 2004/0070949 A1 | 4/2004 | Oikawa | |
| 2004/0105233 A1* | 6/2004 | Lai | H05K 7/202 |
| | | | 361/695 |
| 2005/0047086 A1* | 3/2005 | Gedamu | H05K 7/20727 |
| | | | 257/E23.099 |
| 2005/0061485 A1 | 3/2005 | Hirafuji | |
| 2005/0094371 A1* | 5/2005 | Lai | G06F 1/203 |
| | | | 361/679.48 |
| 2005/0231910 A1* | 10/2005 | Malone | H05K 7/20727 |
| | | | 361/695 |
| 2005/0231913 A1 | 10/2005 | Malone | |
| 2005/0241802 A1 | 11/2005 | Malone | |
| 2005/0241810 A1* | 11/2005 | Malone | F04D 25/166 |
| | | | 165/122 |
| 2006/0012955 A1* | 1/2006 | Vinson | H05K 7/20727 |
| | | | 361/695 |
| 2006/0262505 A1 | 11/2006 | Cheng | |
| 2007/0070604 A1 | 3/2007 | Tomioka | |
| 2008/0123298 A1 | 5/2008 | Takeguchi | |
| 2009/0025909 A1 | 1/2009 | Huang | |
| 2009/0097202 A1* | 4/2009 | Gipson | B01D 46/70 |
| | | | 95/279 |
| 2009/0168331 A1 | 7/2009 | Fujiwara | |
| 2010/0097760 A1 | 4/2010 | Azar | |
| 2010/0177477 A1 | 7/2010 | Cheng | |
| 2010/0300652 A1 | 12/2010 | Lee | |
| 2011/0108250 A1* | 5/2011 | Horng | H01L 23/427 |
| | | | 165/121 |
| 2011/0130891 A1* | 6/2011 | Nielsen | G06F 1/206 |
| | | | 713/320 |
| 2011/0164384 A1* | 7/2011 | Vogel | F28D 1/024 |
| | | | 165/122 |
| 2011/0464384 | 7/2011 | Vogel | |
| 2012/0047917 A1 | 3/2012 | Rafalovich | |
| 2013/0000122 A1 | 1/2013 | Yang et al. | |
| 2013/0021746 A1* | 1/2013 | Campbell | H05K 7/20827 |
| | | | 165/104.13 |
| 2013/0141865 A1 | 6/2013 | Wu | |
| 2013/0155622 A1 | 6/2013 | Chang | |
| 2013/0329357 A1 | 12/2013 | Degner | |
| 2014/0160679 A1 | 6/2014 | Kelty | |
| 2014/0198438 A1 | 7/2014 | Aurongzeb | |
| 2014/0268550 A1 | 9/2014 | Kinstle | |
| 2014/0268553 A1 | 9/2014 | Van | |
| 2014/0321056 A1* | 10/2014 | Yoshikawa | H05K 7/20818 |
| | | | 361/690 |
| 2015/0212556 A1 | 7/2015 | Hrehor | |
| 2016/0007501 A1 | 1/2016 | Nakanishi et al. | |
| 2016/0018139 A1 | 1/2016 | Olsson | |
| 2017/0127573 A1 | 5/2017 | Hirai et al. | |
| 2017/0367222 A1* | 12/2017 | Heydari | H05K 7/20172 |
| 2018/0292145 A1 | 10/2018 | Sun et al. | |
| 2018/0372419 A1 | 12/2018 | Liu et al. | |
| 2019/0150321 A1* | 5/2019 | Hirai | H05K 7/20727 |
| | | | 361/699 |
| 2019/0200487 A1* | 6/2019 | Coteus | H05K 7/1489 |
| 2019/0203983 A1 | 7/2019 | Jeon | |
| 2019/0239384 A1* | 8/2019 | North | G06F 1/3296 |
| 2019/0320555 A1* | 10/2019 | Flavin | H05K 7/20409 |
| 2021/0011534 A1* | 1/2021 | Yin | H05K 7/20863 |
| 2021/0219464 A1 | 7/2021 | Ma | |
| 2021/0378151 A1* | 12/2021 | Gao | H05K 7/20745 |
| 2023/0022058 A1* | 1/2023 | Geng | H05K 3/0014 |

FOREIGN PATENT DOCUMENTS

| | | |
|---|---|---|
| CN | 205384573 U | 7/2016 |
| CN | 205809805 U | 12/2016 |
| CN | 205810782 U | 12/2016 |

\* cited by examiner

US 11,997,835 B2

COOLING SYSTEM

CROSS-REFERENCE TO RELATED APPLICATIONS

This application is a divisional of U.S. patent application Ser. No. 17/217,817, filed on Mar. 30, 2021, which is a continuation of U.S. patent application Ser. No. 16/242,845, now U.S. Pat. No. 10,973,152, filed on Jan. 8, 2019, which claims priority to and benefit of Chinese Patent Application 201711088430.3, filed on Nov. 8, 2017. The aforementioned applications are hereby incorporated by reference in their entireties.

TECHNICAL FIELD

The present disclosure relates to autonomous driving technology, and more particularly, to a cooling system.

BACKGROUND

Currently, in order to achieve autonomous driving of a vehicle, typically one or even more vehicle-mounted computer servers for decision making and controlling are provided on such vehicle. As complicated techniques are involved in autonomous driving, it is desired that the vehicle-mounted computer servers could have more powerful functions, with not only high computing capabilities and high processing efficiencies, but also capabilities of running stably for a long time (e.g., high anti-vibration capability and excellent cooling effect). Hence, compared with ordinary computer servers, a vehicle-mounted computer server may have a larger number of components to be installed therein, e.g., a number of sets of core components, such as a number of Central Processing Units (CPUs), a number of Graphics Processing Units (GPUs), a number of expansion cards, one or more power sources, and the like.

Due to a limited space in a vehicle, these core components may typically be arranged densely and compactly in a case having a limited space. However, some components (referred to as "heat generating components" hereinafter) will generate heat during their operation. A heat generating component may malfunction as its temperature increases. Thus, it is desired to dissipate the heat generated by the heat generating component timely, so as to ensure that the core component can function normally.

SUMMARY

According to some embodiments of the present disclosure, a cooling system is provided. The cooling system includes: a first set of fans mounted on an inward-facing side of an air inlet on an outer shell of a case; a second set of fans mounted on an inward-facing side of an air outlet on the outer shell of the case, for generating, in cooperation with the first set of fans, a high-pressure airflow from the air inlet to the air outlet; a first heat sink connected to a heat generating component in the case, for absorbing heat from the heat generating component and transferring the absorbed heat to a second heat sink; and the second heat sink mounted on an inward-facing side of the second set of fans and cooled by the high-pressure airflow.

BRIEF DESCRIPTION OF THE DRAWINGS

The figures are provided for facilitating further understanding of the present disclosure. The figures constitute a portion of the description and can be used in combination with the embodiments of the present disclosure to interpret, rather than limiting, the present disclosure. In the figures.

DETAILED DESCRIPTION OF THE EMBODIMENTS

In the following, the solutions according to the embodiments of the present disclosure will be described clearly and completely with reference to the figures, such that the solutions can be better understood by those skilled in the art. Obviously, the embodiments described below are only some, rather than all, of the embodiments of the present disclosure. All other embodiments that can be obtained by those skilled in the art based on the embodiments described in the present disclosure without any inventive efforts are to be encompassed by the scope of the present disclosure.

The present disclosure provides a cooling system, capable of cooling a heat generating component in a computer server quickly, so as to ensure that the heat generating component can function stably. With the cooling system according to the present disclosure, a first heat sink may transfer the heat generated by the heat generating component directly to the second heat sink, and then the first set of fans and the second set of fans generate a high-pressure airflow for cooling the second heat sink. With the cooling system according to the present disclosure, on one hand, the first heat sink may transfer the heat generated by the heat generating component directly and quickly to the second heat sink, so as to increase the speed of heat dissipation and ensure that the heat generating component may function stably. On the other hand, the second heat sink is arranged near the air outlet on the outer shell of the case, such that the high-pressure airflow may dissipate the heat on the second heat sink quickly to the outside of the case, thereby further increasing the speed of heat dissipation and improving the cooling effect.

The cooling system according to the embodiment of the present disclosure may be applied to a vehicle-mounted computer server in an unmanned vehicle, a computer server in an unmanned plane, a computer server in an unmanned ship, a robot, or any other computer servers for which heat dissipation is desired. The present disclosure is not limited to any specific application scenario.

Figure 1:
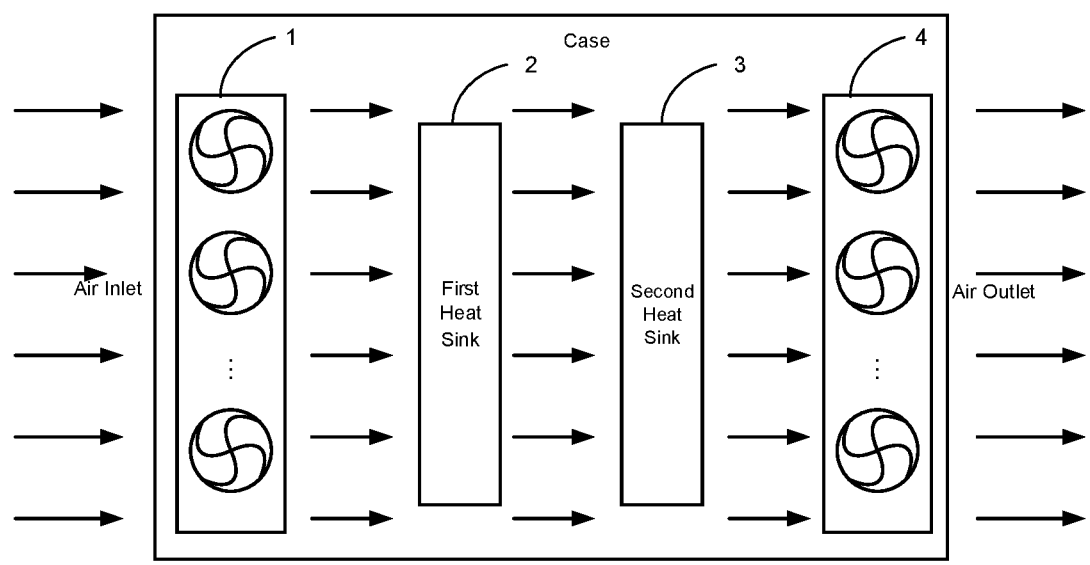
FIG. 1 is a schematic diagram showing a structure of a cooling system according to some embodiments of the present disclosure.

Referring to FIG. 1, which is a schematic diagram showing a structure of a cooling system according to an embodiment of the present disclosure, the cooling system is provided within a case including a heat generating component. An air inlet and an air outlet are provided on two panels on opposite sides of an outer shell of the case, respectively. The cooling system includes a first set of fans 1, a first heat sink 2, a second heat sink 3 and a second set of fans 4.

The first set of fans 1 is mounted on an inward-facing side of the air inlet on the outer shell of the case.

The second set of fans 4 is mounted on an inward-facing side of the air outlet on the outer shell of the case, for generating, in cooperation with the first set of fans 1, a high-pressure airflow from the air inlet to the air outlet.

The first heat sink 2 is connected to the heat generating component in the case, for absorbing heat from the heat generating component and transferring the absorbed heat to the second heat sink 3.

The second heat sink 3 is mounted on an inward-facing side of the second set of fans 4 and cooled by the high-pressure airflow.

Figure 2A:
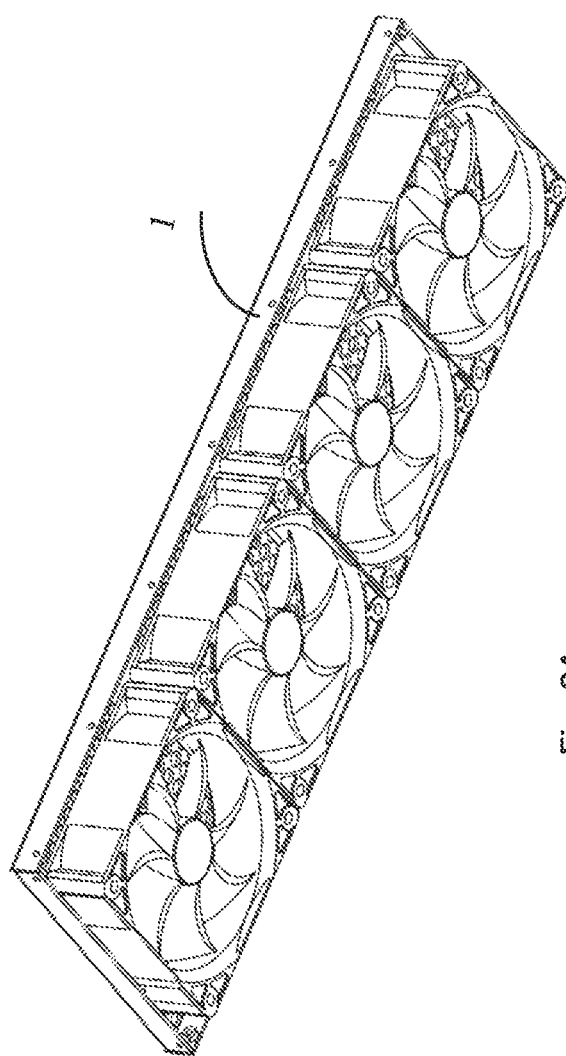
FIG. 2A and FIG. 2B are schematic diagrams showing a structure of a first set of fans and a structure of a second set of fans, respectively.
Figure 2B:
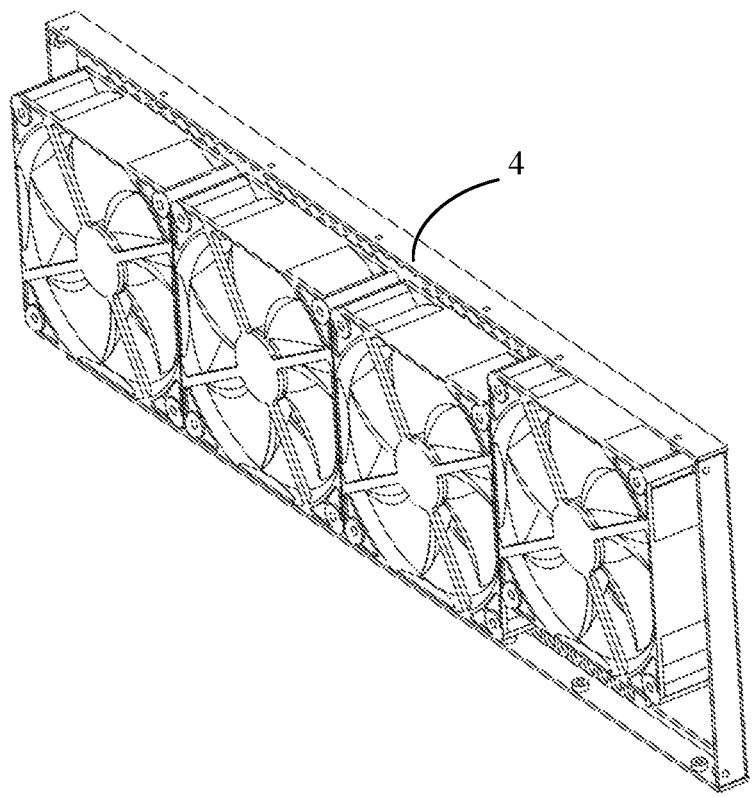

In some embodiments of the present disclosure, the first set of fans 1 and the second set of fans 4 may each include a plurality of fans. The number of fans in each set may be configured flexibly depending on actual requirements. For example, the more components for which heat dissipation is desired, or the larger the space for which heat dissipation is desired, the more fans may to be mounted. FIG. 2A is a schematic diagram showing a structure of the first set of fans 1. FIG. 2B is a schematic diagram showing a structure of the second set of fans 4. In FIGS. 2A and 2B, the first set of fans 1 and the second set of fans 4 each include four fans.

In some embodiments of the present disclosure, the second heat sink 3 may be configured as cooling fins formed in one piece, or a plurality of sets of cooling fins. This may be configured flexibly by those skilled in the art depending on actual requirements and the present disclosure is not limited to any of these configurations.

In some embodiments of the present disclosure, the first heat sink 2 may have any of the following structures.

Structure 1: The first heat sink 2 includes a plurality of sets of heat pipes 21, each set of heat pipes 21 corresponding to one heat generating component.

Structure 2: The first heat sink 2 includes a plurality of turbofan heat sinks 22 each corresponding to one heat generating component.

Structure 3: The first heat sink 2 includes at least one water cooling device 23 each corresponding to a plurality of heat generating components.

Structure 4: The first heat sink 2 includes at least one set of heat pipes 21 and at least one turbofan heat sink 22, each set of heat pipes 21 corresponding to one heat generating component and each turbofan heat sink 22 corresponding to one heat generating component.

Structure 5: The first heat sink 2 includes at least one set of heat pipes 21 and at least one water cooling device 23, each set of heat pipes 21 corresponding to one heat generating component and each water cooling device 23 corresponding to a plurality of heat generating components.

Structure 6: The first heat sink 2 includes at least one turbofan heat sink 22 and at least one water cooling device 23, each turbofan heat sink 22 corresponding to one heat generating component and each water cooling device 23 corresponding to a plurality of heat generating components.

Structure 7: The first heat sink 2 includes at least one set of heat pipes 21, at least one turbofan heat sink 22 and at least one water cooling device 23, each set of heat pipes 21 corresponding to one heat generating component, each turbofan heat sink 22 corresponding to one heat generating component and each water cooling device 23 corresponding to a plurality of heat generating components.

In the following, the above Structures 1, 2 and 3 will be described in detail with reference to the figures, such that the structures of the above heat pipe 21, turbofan heat sink 22 and water-cooling device 23 can be better understood by those skilled in the art.

Embodiment 1

Figure 3A:
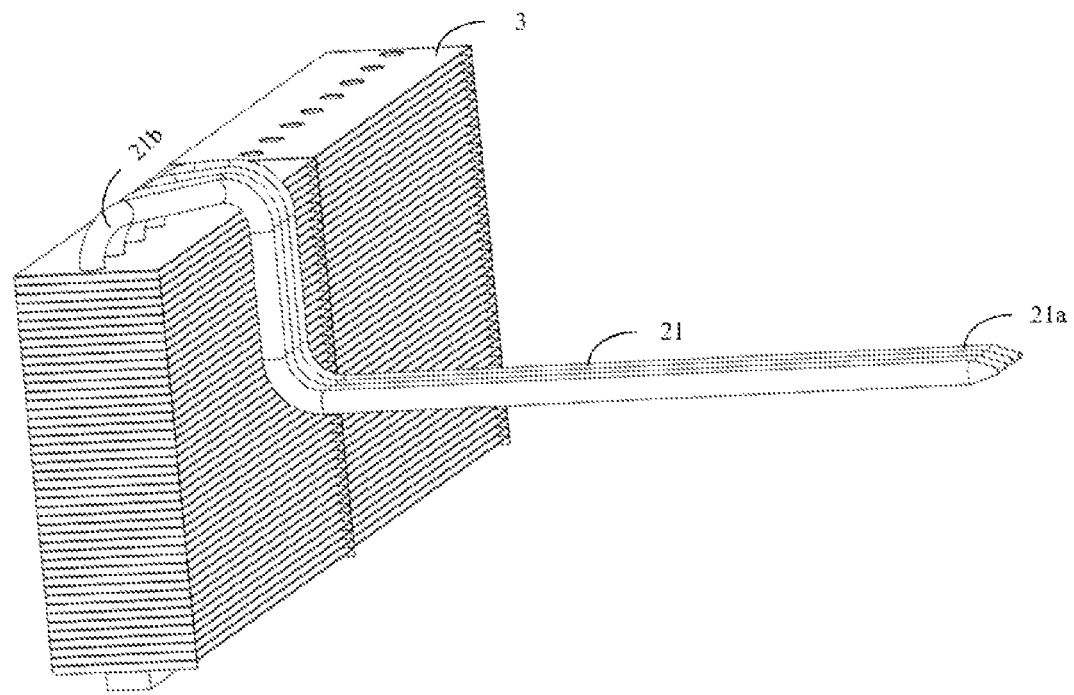
FIG. 3A is a schematic diagram showing a structure of a first heat sink including a plurality of sets of heat pipes according to some embodiments of the present disclosure.

Referring to FIG. 3A, which is a schematic diagram showing an exemplary structure of a first heat sink 2 according to an embodiment of the present disclosure, the first heat sink 2 includes a plurality of sets of heat pipes 21. Each set of heat pipes 21 corresponds to one heat generating component, and includes at least one heat pipe each having one end 21a connected to the one heat generating component and another end 21b connected to the second heat sink.

In an embodiment of the present disclosure, for different heat generating components, different numbers of heat pipes may be included in their corresponding sets of heat pipes. For example, the higher the power of the heat generating component is, the larger number of heat pipes its corresponding set of heat pipes will include. For example, each GPU may correspond to a set of four copper heat pipes each having a diameter of 8 mm.

In order to further increase the contact area between the heat pipes and the heat generating component and thus the speed at which the heat pipes absorb the heat, in an embodiment of the present disclosure, the heat generating component may have its surface coated with a layer of thermally conductive silicone grease. The one end 21a of each heat pipe in each set of heat pipes may be connected to the heat generating component via a first mounting device.

Figure 3B:
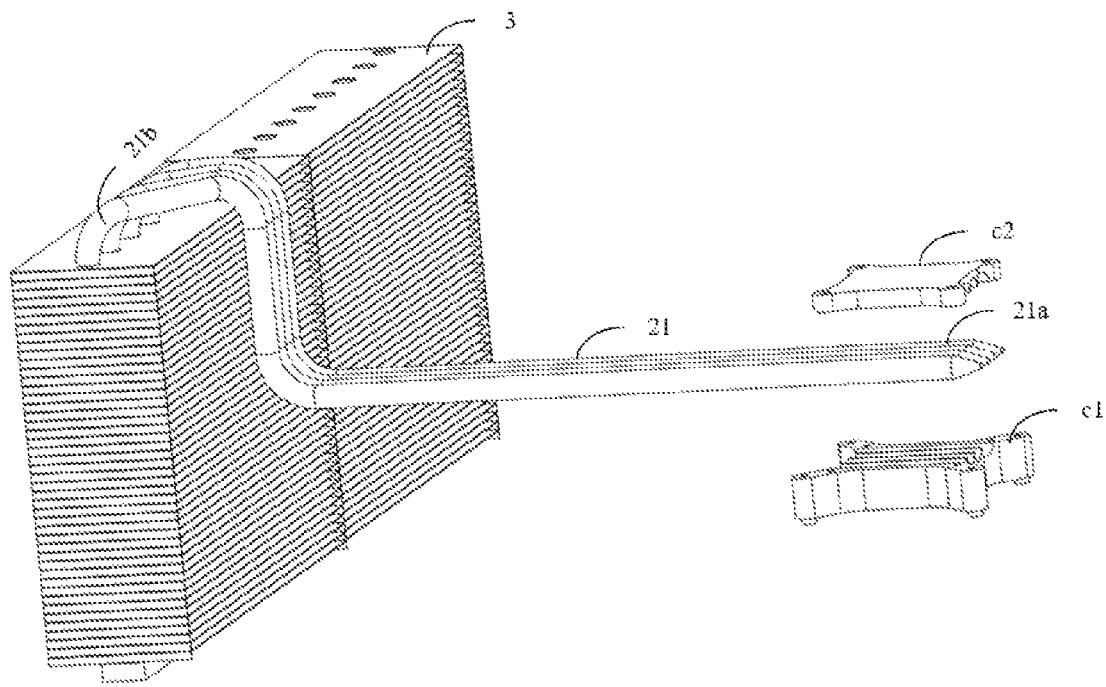
FIG. 3B is a schematic diagram showing a structure of a first mounting device according to some embodiments of the present disclosure.
Figure 3C:
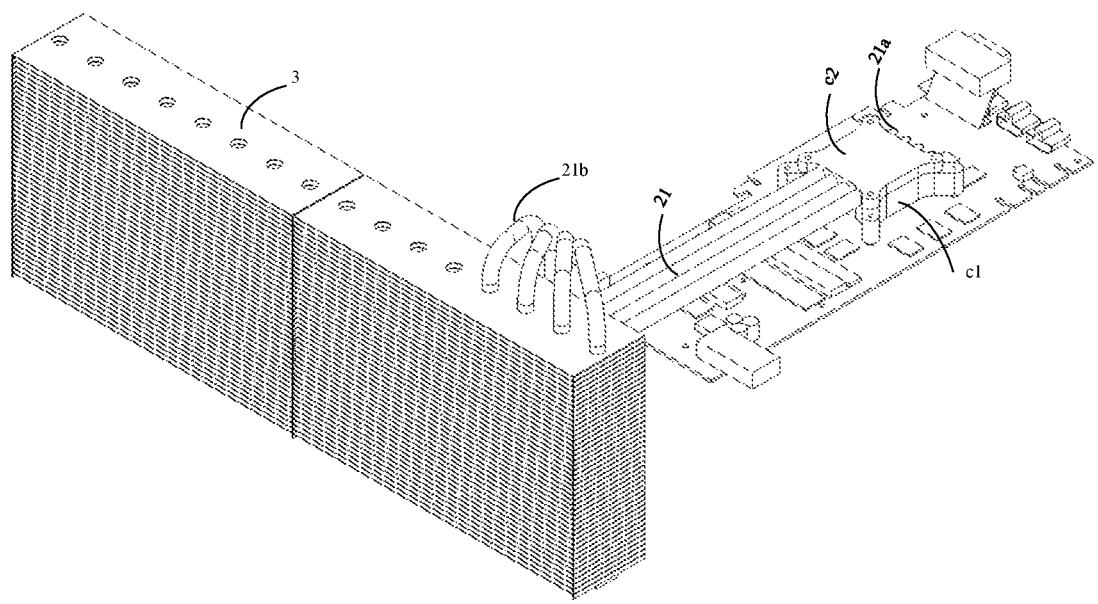
FIG. 3C is a schematic diagram showing a heat pipe mounted on a heat generating component via a first mounting device according to some embodiments of the present disclosure.

In an example, the first mounting device may have a structure shown in FIG. 3B. As shown, the first mounting device includes a heat pipe base c1 and a heat pipe cover c2. The heat pipe base c1 is mounted fixedly on the thermally conductive silicone grease for the heat generating component, and has a plurality of grooves or slots provided on its top for mounting the heat pipes. The one end 21a of each heat pipe in each set of heat pipes is pressed tightly onto the heat pipe base c1 by the heat pipe cover c2, as shown in FIG. 3C. The heat pipe base c1 and the heat pipe cover c2 may be fastened to each other by screws or bolts.

Figure 3D:
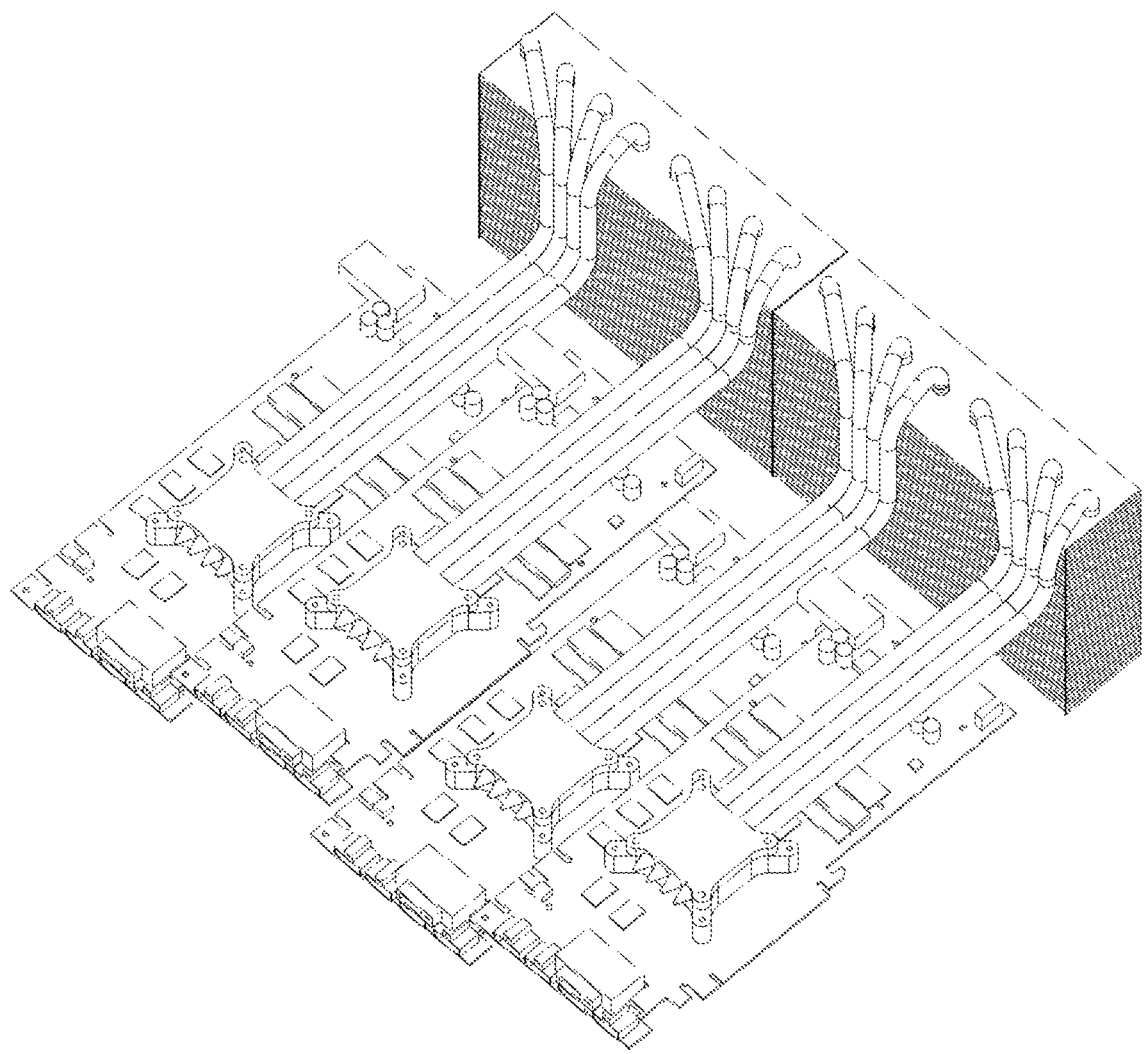
FIG. 3D is a schematic diagram showing a plurality of sets of heat pipes provided on respective heat generating components according to some embodiments of the present disclosure.

FIG. 3D is a schematic diagram showing a structure in which a plurality of sets of heat pipes are provided on respective heat generating components.

Figure 3E:
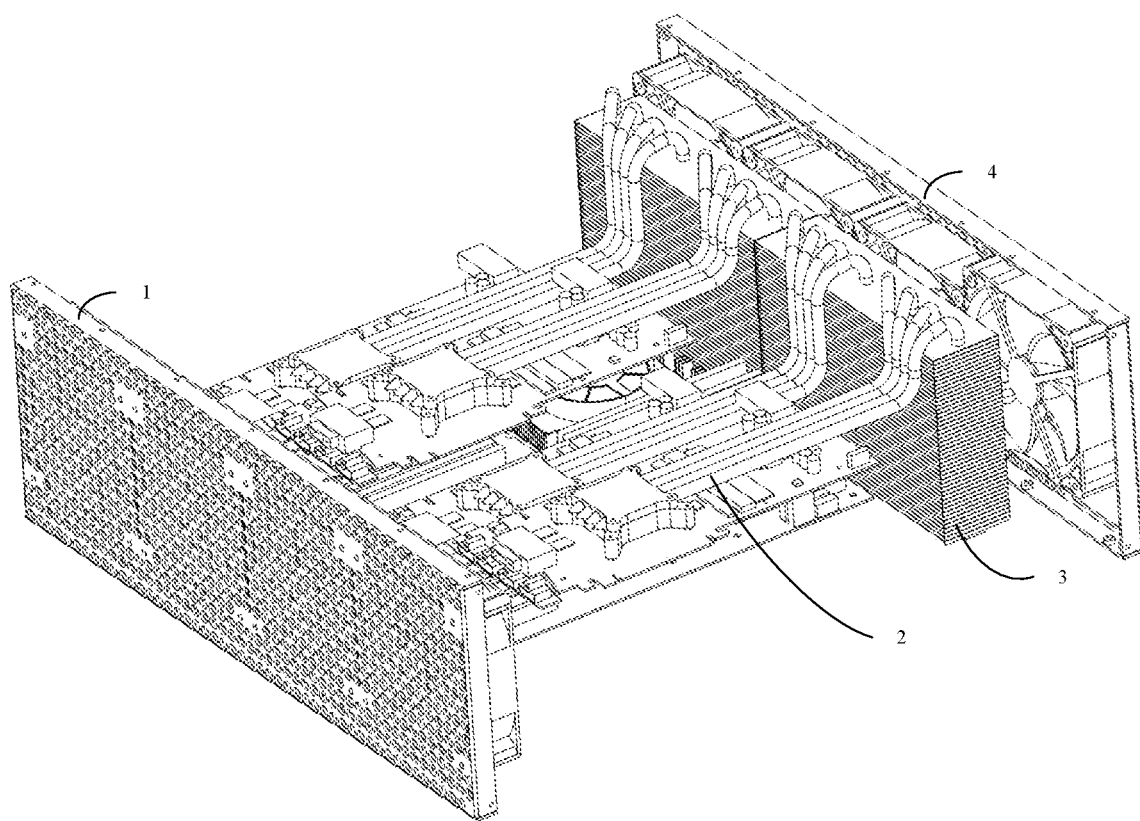
FIG. 3E is a schematic diagram showing a structure of a cooling system according to some embodiments of the present disclosure.

FIG. 3E is a schematic diagram showing a structure of a cooling system including a first set of fans 1, a first heat sink 2, a second heat sink 3 and a second set of fans 4.

Of course, in another example, the first mounting device may include a heat pipe base and a heat pipe cover. The heat pipe base is mounted fixedly on the thermally conductive silicone grease for the heat generating component, and the heat pipe cover has at least one groove or slot provided at its bottom for mounting the at least one heat pipe. The one end 21a of each heat pipe in each set of heat pipes is pressed tightly onto the heat pipe base by the heat pipe cover. The heat pipe base and the heat pipe cover may be fastened to each other by screws or bolts.

Of course, in another example, the first mounting device may include a heat pipe base, which is mounted fixedly on the thermally conductive silicone grease for the heat generating component. The one end 21a of each heat pipe in each set of heat pipes is welded to the heat pipe base.

In order to further increase the speed of heat dissipation, in an embodiment of the present disclosure, each of the heat pipe cover c2 and the heat pipe base c1 of the above first mounting device may have its surface coated uniformly with a layer of thermally conductive silicone grease, and/or the one end 21a of the heat pipe may have its surface coated uniformly with a layer of thermally conductive silicone grease.

In an embodiment of the present disclosure, the heat pipe may include a pipe shell, a wick within the pipe shell and a pipe cover for sealing the pipe shell. The pipe shell may be filled with a volatile liquid having a low boiling point.

In an embodiment of the present disclosure, the wick may be made of a porous material.

In an embodiment of the present disclosure, air may be drawn out to form a negative pressure of $1.3*10^{-1} \sim 1.3*10^{-4}$Pa inside the pipe shell and then the pipe shell may be filled with the volatile liquid having the low boiling point. When the wick is filled with the liquid, the pipe shell is sealed with the pipe cover.

The principle of the heat pipe absorbing the heat from the heat generating component and transferring the absorbed heat to the second heat sink 3 may be as follows. When the one end 21a of the heat pipe is heated, the liquid in the wick is vaporized into vapor and the heat generated by the heat generating component may be absorbed during the vaporization of the liquid. The vapor flows towards the other end 21b of the heat pipe, subject to a small pressure, and is liquefied into a liquid when meeting the second heat sink 3 having a relatively low temperature at the other end 21b (as the second heat sink 3 is continuously cooled by the high-pressure airflow, it has a lower temperature than the heat pipe). During the liquefaction of the vapor, heat is released to the second heat sink 3. The liquid flows back to the one end 21a, subject to a capillary force of the wick. Cyclically in this way, the heat generated by the heat generating component may be transferred to the second heat sink 3.

In an embodiment of the present disclosure, the material of the heat pipe and the type of the liquid may be any of the following: 1) the pipe shell of the heat pipe may be made of copper and the liquid may be water; 2) the pipe shell of the heat pipe may be made of carbon steel and the liquid may be water; 3) the pipe shell of the heat pipe may be made of a composite of steel and copper and the liquid may be water; 4) the pipe shell of the heat pipe may be made of aluminum and the liquid may be acetone; or 5) the pipe shell of the heat pipe may be made of stainless steel and the liquid may be sodium.

In an embodiment of the present disclosure, the other end 21b of each heat pipe in each set of heat pipes may be connected to the second heat sink 3 by means of welding.

Preferably, in an embodiment of the present disclosure, the heat pipe may have a shape of a prism, e.g., a cylinder or cuboid, and the present disclosure is not limited thereto.

Embodiment 2

Figure 4A:
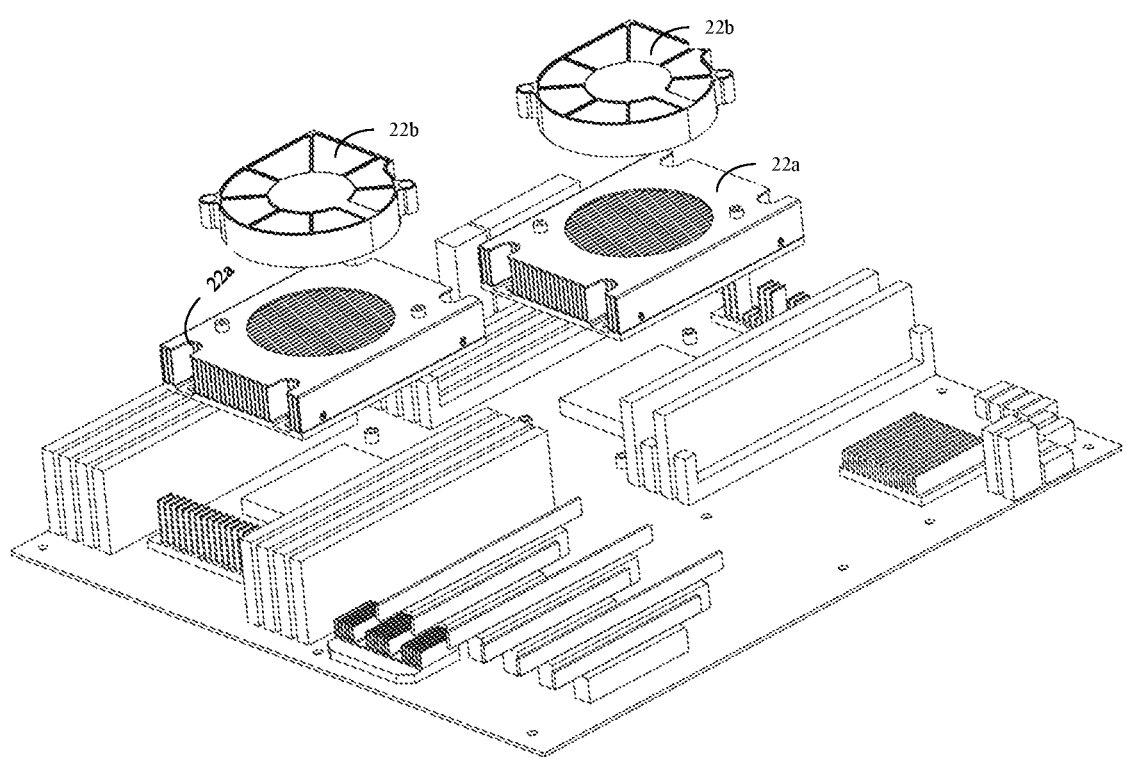
FIG. 4A and FIG. 4B are schematic diagrams each showing a structure of a first heat sink including a turbofan heat sink according to some embodiments of the present disclosure.
Figure 4B:
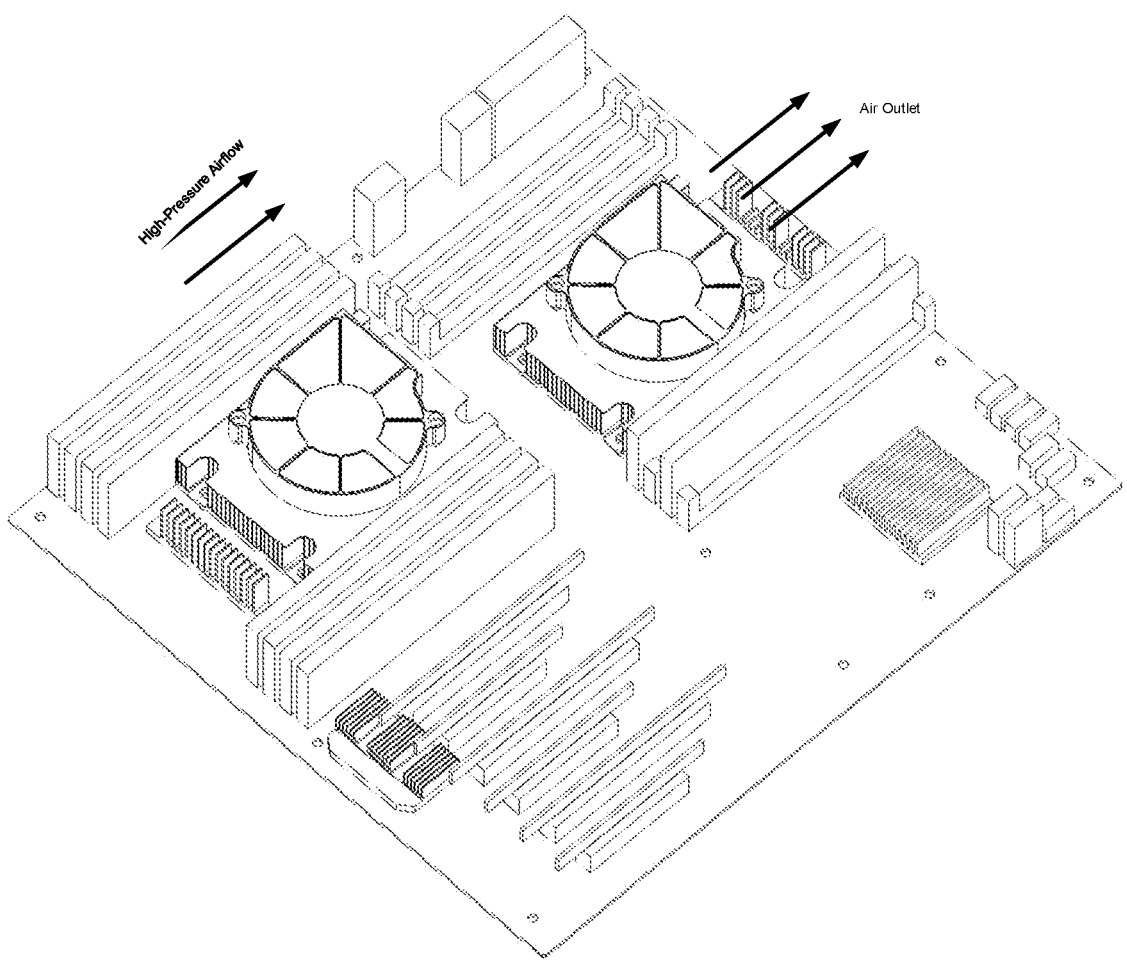

Referring to FIG. 4A, which shows another exemplary structure of a first heat sink 2 according to an embodiment of the present disclosure, the first heat sink 2 includes a plurality of turbofan heat sinks 22 each corresponding to one heat generating component. Each of the plurality of turbofan heat sinks 22 includes a cooling fin 22a connected to the heat generating component and a turbofan 22b. The turbofan 22b has an air outlet facing a same direction as the high-pressure airflow. The turbofan 22b draws air to blow heat on the cooling fin 22a to the second heat sink 3, as shown in FIG. 4B.

In order to further increase the contact area between the turbofan heat sink 22 and the heat generating component and thus the speed at which the heat is absorbed, in an embodiment of the present disclosure, the heat generating component may have its surface coated with a layer of thermally conductive silicone grease. The cooling fin 22a of the turbofan heat sink 22 may be mounted fixedly on the thermally conductive silicone grease for the heat generating component.

Embodiment 3

Figure 5:
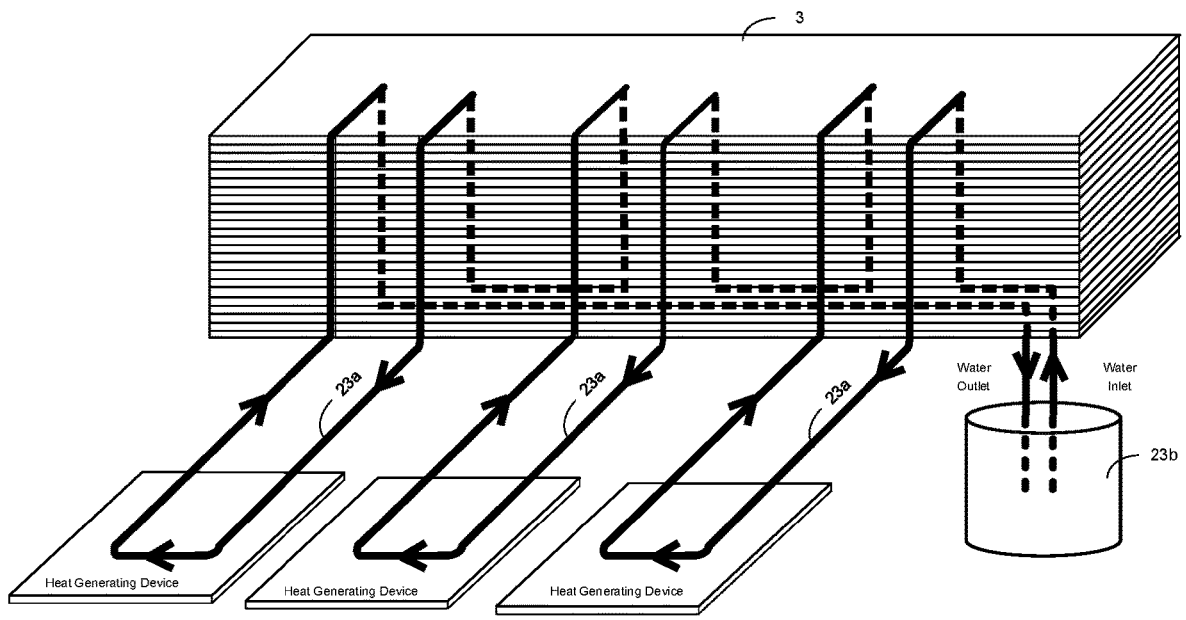
FIG. 5 is a schematic diagram showing a structure of a first heat sink including a water cooling device according to some embodiments of the present disclosure.

Referring to FIG. 5, which shows another exemplary structure of a first heat sink 2 according to an embodiment of the present disclosure, the first heat sink 2 includes at least one water cooling device each including a water cooling pipe 23a and a water tank 23b arranged cyclically. The water-cooling pipe 23a has a water inlet and a water outlet each connected to the water tank 23b. Water in the water-cooling pipe 23a, when flowing through one heat generating component, carries heat generated by the one heat generating component to the second heat sink 3 and then flows from the second heat sink 3 and through a next heat generating component.

In an embodiment of the present disclosure, the heat generating component may have its surface coated with a layer of thermally conductive silicone grease. The water-cooling pipe 23a may be mounted on the thermally conductive silicone grease for the heat generating component via a second mounting device. The water-cooling pipe 23a may be twisted spirally around the second heat sink 3, or may be arranged in the second heat sink 3 in a Li-shaped structure (as shown in FIG. 5). The present disclosure is not limited to any of these arrangements. Here, the second mounting device may include a heat pipe base and a heat pipe cover. The heat pipe base may be mounted on the thermally conductive silicone grease for the heat generating component and have at least one groove or slot provided on its top for mounting the at least one water cooling pipe 23a (the groove may be Li-shaped, L-shaped or V-shaped and the present disclosure is not limited to any of these shapes). The water-cooling pipe 23a may be pressed tightly onto the heat pipe base by the heat pipe cover. The structure of the second mounting device may be identical to, or similar with, that of the first mounting device and details thereof will be omitted here.

In order to further increase the speed of heat dissipation, in an embodiment of the present disclosure, each of the heat pipe cover and the heat pipe base of the above second mounting device may have its surface coated uniformly with a layer of thermally conductive silicone grease, and/or one end of the water-cooling pipe 23a that is connected to the heat generating component may have its surface coated uniformly with a layer of thermally conductive silicone grease.

Embodiment 4

According to an embodiment of the present disclosure, in a further example of a first heat sink 2, the first heat sink 2 includes at least one set of heat pipes 21 and at least one turbofan heat sink 22, each set of heat pipes 21 corresponding to one heat generating component and each turbofan heat sink 22 corresponding to one heat generating component. For the structures of the heat pipe 21 and the turbofan heat sink 22, reference can be made to the above embodiments and details thereof will be omitted here.

For example, some of the heat generating components in the case may each have a turbofan heat sink 22 provided thereon and some of the heat generating components in the case may each have heat pipes 21 provided thereon. For example, each CPU on a motherboard may correspond to a turbofan heat sink 22, each GPU on a graphics card may correspond to a set of heat pipes 21, and each power source may correspond to a set of heat pipes 21. As another example, each CPU on a motherboard may correspond to a set of heat pipes 21 and each GPU on a graphics card may correspond to a turbofan heat sink 22. As yet another example, some of CPUs on a motherboard may correspond to a set of heat pipes 21 while some of the CPUs may correspond to a turbofan heat sink 22, and some of GPUs on a graphics card can correspond to a set of heat pipes 21 while some of the GPUs may correspond to a turbofan heat sink 22. This can be selected flexibly by those skilled in the art depending on actual requirements and the present disclosure is not limited thereto.

Figure 6:
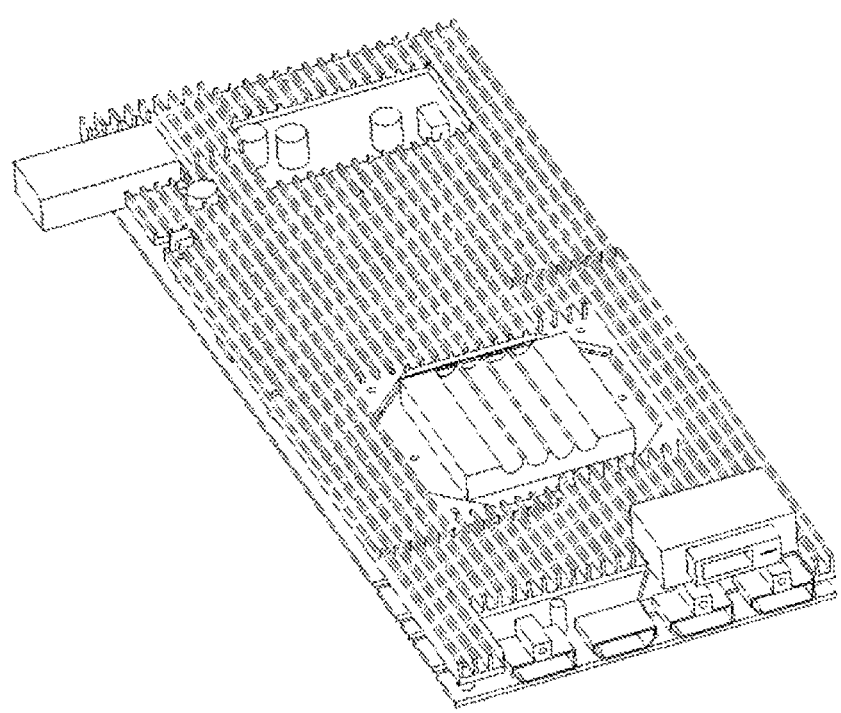
FIG. 6 is a schematic diagram showing a layer of cooling fins provided on a surface of a graphics card according to some embodiments of the present disclosure.

In order to further improve the efficiency of heat dissipation, in an embodiment of the present disclosure, a layer of cooling fins may be provided on a surface of a motherboard, for absorbing heat generated by other components on the motherboard. Additionally or alternatively, a layer of cooling fins may be provided on a surface of a graphics card, for absorbing heat generated by other components on the graphics card. The layer of cooling fins provided on the surface of the motherboard and the layer of cooling fins provided on the surface of the graphics card may be cooled using a high-pressure airflow. As shown in FIG. 6, a layer of cooling fins is provided on a surface of a graphics card.

While the embodiments of the present disclosure have been described above, further alternatives and modifications can be made to these embodiments by those skilled in the art in light of the basic inventive concept of the present disclosure. The claims as attached are intended to cover the above embodiments and all these alternatives and modifications that fall within the scope of the present disclosure.

Obviously, various modifications and variants can be made to the present disclosure by those skilled in the art without departing from the spirit and scope of the present disclosure. Therefore, these modifications and variants are to be encompassed by the present disclosure if they fall within the scope of the present disclosure as defined by the claims and their equivalents.

What is claimed is:

1. A cooling system, comprising:
 a first set of fans located on a first side of an air inlet on a case;
 a second set of fans located on a second side of an air outlet on the case, wherein the first set of fans and the second set of fans are configured to generate an airflow from the air inlet to the air outlet;
 a first heat sink coupled to a component in the case, wherein the first heat sink is structured to absorb heat from the component and to transfer heat to a second heat sink,
 wherein the first heat sink comprises a plurality of heat sinks,
 wherein each of the plurality of heat sinks corresponds to one component, and
 wherein each of the plurality of heat sinks comprises a cooling fin coupled to the component and a fan; and
 wherein the second heat sink is located on an inward-facing side of the second set of fans and is cooled by the airflow.

2. The system of claim 1, wherein the fan has an air outlet facing a same direction as a high-pressure airflow.

3. The system of claim 1, wherein the fan is configured to draw air to blow heat on the cooling fin to the second heat sink.

4. The system of claim 1, wherein a surface of the component has a layer of thermally conductive silicone grease.

5. The system of claim 4, wherein the cooling fin of the heat sink is located fixedly on the thermally conductive silicone grease for the component.

6. The system of claim 1, wherein the second heat sink comprises at least one set of cooling fins.

7. The system of claim 1, wherein the first set of fans are located on an inward-facing side of the air inlet.

8. The system of claim 1, wherein the second set of fans are located on an inward-facing side of the air outlet.

9. A method for cooling, comprising:
 providing a first set of fans located on a first side of an air inlet on a case;
 providing a second set of fans located on a second side of an air outlet on the case, wherein the first set of fans and the second set of fans generate an airflow from the air inlet to the air outlet;
 providing a first heat sink coupled to a component in the case, wherein the first heat sink is structured to absorb heat from the component and to transfer heat to a second heat sink,
 wherein the first heat sink comprises a plurality of heat sinks,
 wherein each of the plurality of heat sinks corresponds to one component, and
 wherein each of the plurality of heat sinks comprises a cooling fin coupled to the component and a fan; and
 wherein the second heat sink is located on an inward-facing side of the second set of fans and is cooled by the airflow.

10. The method of claim 9, wherein the fan has an air outlet facing a same direction as a high-pressure airflow.

11. The method of claim 9, wherein the fan draws air to blow heat on the cooling fin to the second heat sink.

12. The method of claim 9, wherein a surface of the component has a layer of thermally conductive silicone grease.

13. The method of claim 12, wherein the cooling fin of the heat sink is located fixedly on the thermally conductive silicone grease for the component.

* * * * *